US009318405B2

(12) United States Patent
Xu et al.

(10) Patent No.: US 9,318,405 B2
(45) Date of Patent: Apr. 19, 2016

(54) WAFER LEVEL PACKAGE WITHOUT SIDEWALL CRACKING

(71) Applicant: QUALCOMM Incorporated, San Diego, CA (US)

(72) Inventors: Jianwen Xu, San Diego, CA (US); Lizabeth Ann Keser, San Diego, CA (US); William Stone, San Diego, CA (US); Steve Joseph Bezuk, San Diego, CA (US); Nicholas Ka Ming Yu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/702,276

(22) Filed: May 1, 2015

(65) Prior Publication Data
US 2015/0318229 A1    Nov. 5, 2015

Related U.S. Application Data

(60) Provisional application No. 61/987,210, filed on May 1, 2014.

(51) Int. Cl.
| | | |
|---|---|---|
| H01L 23/12 | (2006.01) | |
| H01L 21/00 | (2006.01) | |
| H01L 23/31 | (2006.01) | |
| H01L 23/528 | (2006.01) | |
| H01L 23/532 | (2006.01) | |
| H01L 23/498 | (2006.01) | |
| H01L 21/78 | (2006.01) | |

(Continued)

(52) U.S. Cl.
CPC .......... *H01L 23/3157* (2013.01); *H01L 21/561* (2013.01); *H01L 21/78* (2013.01); *H01L 23/28* (2013.01); *H01L 23/3114* (2013.01); *H01L 23/3185* (2013.01); *H01L 23/49816* (2013.01); *H01L 23/528* (2013.01); *H01L 23/5329* (2013.01); *H01L 23/53209* (2013.01)

(58) Field of Classification Search
CPC ............... H01L 21/56; H01L 24/94; H01L 2221/68327; H01L 24/25; H01L 23/28; H01L 23/3114; H01L 23/3185; H01L 21/78; H01L 21/561
See application file for complete search history.

(56) References Cited

U.S. PATENT DOCUMENTS 5,879,964 A * 3/1999 Paik et al. ..................... 438/113
6,215,172 B1   4/2001 Schoenfeld
(Continued)

FOREIGN PATENT DOCUMENTS

JP    2009182155 A    8/2009

OTHER PUBLICATIONS

Liu C.H., et al., "Adaptable and Integrated Packaging Platform for MEMS-based Combo Sensors utilizing Innovative Wafer-Level Packaging Technologies," IEEE 63rd Electronic Components and Technology Conference (ECTC), May 2013, pp. 1675-1681.

*Primary Examiner* — Alonzo Chambliss
(74) *Attorney, Agent, or Firm* — Muncy, Geissler, Olds & Lowe, P.C.

(57) ABSTRACT

A wafer level package device may include a molding compound that encapsulates a substrate, a back end of line and front end of line layer on the substrate and a passivation layer of a redistribution layer without encapsulating a metal layer on the passivation layer. The molding compound may eliminate sidewall chipping and cracking as well as reduce the need for back side lamination.

20 Claims, 6 Drawing Sheets

(51) Int. Cl.
*H01L 23/28* (2006.01)
*H01L 21/56* (2006.01)

(56) References Cited

U.S. PATENT DOCUMENTS

| | | | | |
|---|---|---|---|---|
| 6,284,984 B1 * | 9/2001 | Ohyama | ................ | H05K 1/112 174/260 |
| 6,580,152 B2 | 6/2003 | Hasegawa | | |
| 7,691,726 B2 * | 4/2010 | Seng | ............................ | 438/462 |
| 7,927,922 B2 * | 4/2011 | Shen et al. | .................... | 438/114 |
| 8,053,869 B2 | 11/2011 | McKerreghan et al. | | |
| 8,456,002 B2 * | 6/2013 | Lin et al. | ...................... | 257/734 |
| 2003/0038343 A1 * | 2/2003 | Hasegawa | ..................... | 257/620 |
| 2007/0161155 A1 * | 7/2007 | Yang | ............................ | 438/110 |
| 2011/0024167 A1 * | 2/2011 | Hashimoto | .......... | H05K 3/4688 174/258 |
| 2012/0273957 A1 * | 11/2012 | Meyer | ........................... | 257/773 |
| 2013/0280826 A1 * | 10/2013 | Scanlan et al. | .................. | 438/15 |

* cited by examiner

WAFER LEVEL PACKAGE WITHOUT SIDEWALL CRACKING

CROSS-REFERENCE TO RELATED APPLICATIONS

The present Application for patent claims the benefit of U.S. Provisional Application No. 61/987,210, entitled "METHOD TO CREATE FOOTPRINT MATCH WLP PACKAGES WITHOUT SIDEWALL CRACK WITH FOWLP RECONSTITUTION PROCESS," filed May 1, 2014, assigned to the assignee hereof, and expressly incorporated herein by reference in its entirety.

FIELD OF THE DISCLOSURE

This disclosure relates generally to wafer level packaging (WLP), and more specifically, but not exclusively, to a WLP with a partially encapsulated redistribution layer (RDL).

BACKGROUND

Wafer level packaging allows packaging an integrated circuit while it remains in the wafer. It is a chip-scale package technology. WLP can integrate wafer fabrication, packaging, test, and burn-in at the wafer level in order to streamline a device's manufacture. It consists of extending the wafer fabrication processes to include device interconnection. WLP attaches the top and bottom outer layers of packaging, and the solder bumps, to integrated circuits while still in the wafer, and then dicing the wafer.

Different types of WLP exists, such as fan-in WLP and fan-out WLP. Fan-in WLP uses layout package connections within the chip area, and when the scale and count of on-chip bond pads does not match with standard packaging scales, a RDL of metal interconnect can be used to fan-in to ball-grid or pillar-grid arrays (BGA/PGA) within the chip-area. However, when the needed number of connections cannot be made within the chip area, mold compound materials can be used to provide physical area adjacent to an original chip such that package connections can be arranged on a fan-out area when seen from above.

To reduce manufacturing costs further, a fan-in WLP process for manufacturing an 8" Si wafers may use a 12" fan-out WLP process. This can result in a significant cost saving (up to 30%). However, to build a traditionally fan-out WLP requires adding a thick mold compound to the sidewalls. It's extremely difficult to reduce sidewall width and minimize form factor to match fan-in wafer level package.

One of these difficulties in fan-in WLP products can be sidewall chipping and cracking, which can cause yield loss and lead to surface mount technology failures and reliability failures. Sidewall chipping and cracking can account for a high level of customer returns. Current semiconductor assembly and tests are unable to control chipping and cracking within ten percent of the die's width and length. Current automatic inspections can provide quality assurance measures, but the capital investment and reduced throughput can be costly. Furthermore, the cracking and chipping may not be eliminated using automatic inspections, but merely prevented from reaching the customer.

Accordingly, there is a need for systems, apparatus, and methods that improve upon conventional approaches including the improved methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

Some examples of the disclosure are directed to systems, apparatus, and methods for a wafer level package device that includes a substrate having a non-active substrate side extending between a first substrate sidewall and a second substrate sidewall and an active substrate side extending between a third substrate sidewall and a fourth substrate sidewall; a redistribution layer coupled to the active substrate side, the redistribution layer having a metal layer and a dielectric layer; and a molding compound encapsulating the substrate and the metal layer being free of the molding compound.

Some examples of the disclosure are directed to systems, apparatus, and methods for a wafer level package device that includes a substrate having a non-active substrate side extending between a first substrate sidewall and a second substrate sidewall and an active substrate side extending between a third substrate sidewall and a fourth substrate sidewall; a redistribution layer coupled to the active substrate side, the redistribution layer having a metal layer and a dielectric layer; and a molding compound having a first molding compound sidewall and a second molding compound sidewall, the molding compound encapsulating the substrate while leaving the metal layer exposed such that a width between the first molding compound sidewall and the first substrate sidewall is greater than a width between the first molding compound sidewall and the third substrate sidewall.

Some examples of the disclosure are directed to systems, apparatus, and methods for a wafer level package device may include a substrate having a non-active substrate side extending between a first substrate sidewall and a second substrate sidewall and an active substrate side extending between a third substrate sidewall and a fourth substrate sidewall; a redistribution layer coupled to the active substrate side, the redistribution layer having a dielectric layer in contact with the active substrate side, a polymer layer on the dielectric layer, and a metal layer in the polymer layer; a molding compound having a first molding compound sidewall even with the third substrate sidewall, a second molding compound sidewall even with the fourth substrate sidewall, a third molding compound sidewall extending horizontally beyond the first molding compound sidewall, and a fourth molding compound sidewall extending horizontally beyond the second molding compound sidewall; and the molding compound encapsulating the substrate such that a width between the third molding compound sidewall and the first substrate sidewall is greater than a width between the first molding compound sidewall and the first substrate sidewall.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The disclosure is directed to create a wafer level package using fan out wafer level packaging process. Some advantages may include the ability to create a small factor fan-in WLP without sidewall cracking that can occur when using a standard fan-in WLP process. This smaller form factor may provide cost savings. Additional mold compound (MC) wrapped around die corners may eliminate mold compound peeling from a thin MC sidewall. It may also eliminate Z2 saw chipping and cracking by using a robust MC in the bottom half of the silicon so that no sidewall is required. Thinner package height may be achieved while maintaining structure robustness. This may reduce the need for back side lamination (BSL) for thin MC sidewall and no MC sidewall versions. There may be improved yield and reliability with these various implementations. The improved quality can reduce customer returns. Flexibility of fan-in and fan-out WLP lines may also be used to create form factor match packages, which can mitigate WLP capacity constraint.

Figure 1:
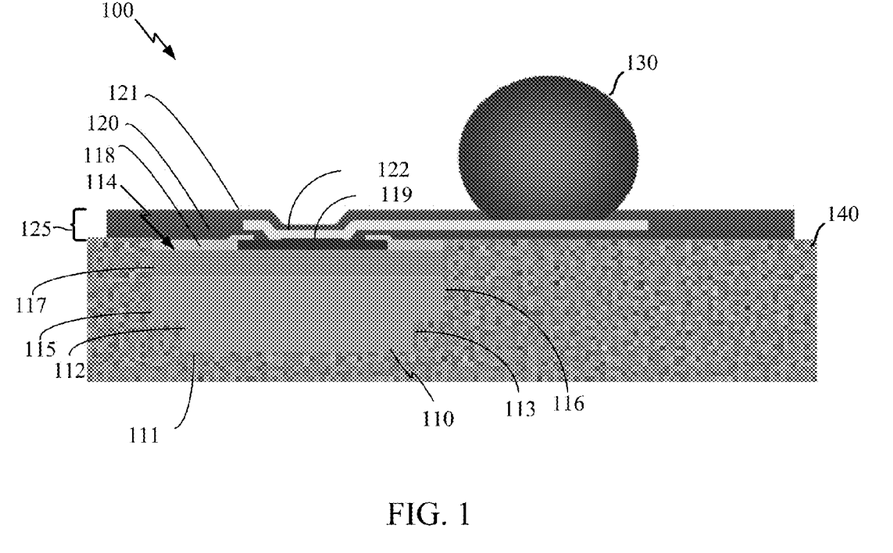
FIG. 1 illustrates a side view of a fan-out WLP in accordance with some examples of the disclosure.

FIG. 1 illustrates a side view of a fan-out wafer level package (WLP) device structure 100. As shown, the WLP device structure 100 may include a substrate 110 (e.g. silicon substrate) having a non-active substrate side 111 extending between a first substrate sidewall 112 and a second substrate sidewall 113 and an active substrate side 114 extending between a third substrate sidewall 115 and a fourth substrate sidewall 116. The substrate 110 may also include a back end of line and front end of line layer 117 as the active substrate side 114. The WLP device structure 100 may also include a passivation layer 118 on the back end of line and front end of line layer 117 coupled to the active substrate side 114, a metal inset 119 in the passivation layer 118, and a redistribution layer 125 on the passivation layer 118. The redistribution layer 125 may include a dielectric layer 120 (e.g. photodielectric layer) on the passivation layer 118 opposite the back end of line and front end of line layer 117, a polymer layer 121 on the dielectric layer 120 opposite the passivation layer 118, and a metal layer 122 in the polymer layer 121 and partially extending through the dielectric layer 120 and the passivation layer 118 to contact the metal inset 119.

As shown in FIG. 1, the WLP device structure 100 may include a solder ball 130 on the polymer layer 121 opposite the dielectric layer 120 that partially extends into the polymer layer 121 to contact the metal layer 122, and a molding compound 140. The molding compound 140 encapsulates the substrate 110, the back end of line and front end of line layer 117, and the passivation layer 118. This allows the molding process to occur before completion of the metal inset 119, the dielectric layer 120, the polymer layer, the metal layer 122, or the solder ball 130, which will reduce manufacturing cost while still allowing the multi-layered redistribution layer to redistribute power from the solder ball 130 to the back end of line and front end of line layer 117. Substrate 110 may be composed of silicon or other suitable material and mold compound 140 may extend well beyond the substrate 110 to form a fan-out area as needed. The back end of line and front end of line layer 117 are where the integrated circuit component may be located. For example, a front end of line (FEOL) process is the first portion of IC fabrication where the individual devices (transistors, capacitors, resistors, etc.) are patterned in the semiconductor. FEOL generally covers everything up to (but not including) the deposition of metal interconnect layers. The back end of line (BEOL) process is the second portion of IC fabrication where the individual devices (transistors, capacitors, resistors, etc.) get interconnected with wiring on the wafer. BEOL generally begins when the first layer of metal is deposited on the wafer. BEOL includes contacts, insulating layers (dielectrics), metal levels, and bonding sites for chip-to-package connections. After the last FEOL step, there is a wafer with isolated transistors (without any wires). In the BEOL part of fabrication stage contacts (pads), interconnect wires, vias and dielectric structures are formed.

Figure 2:
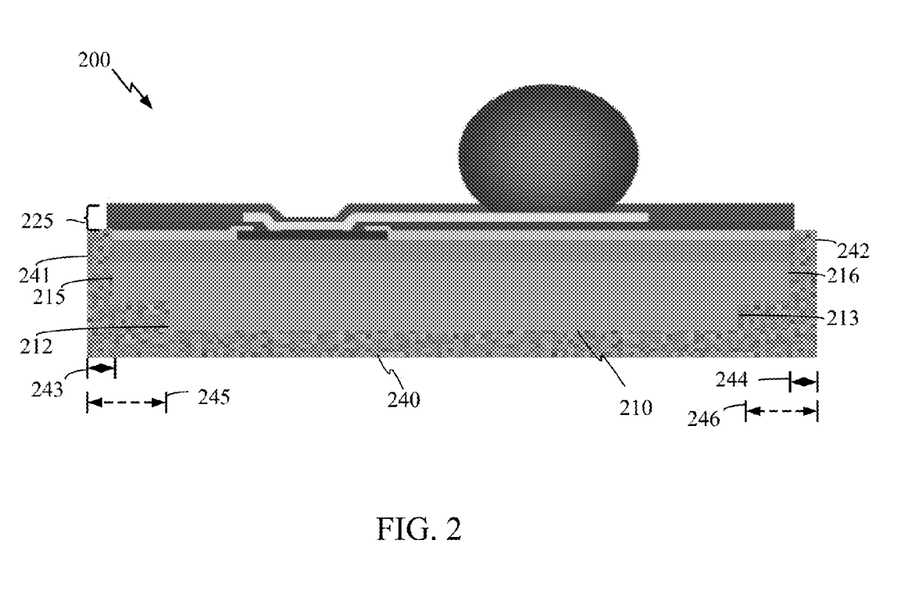
FIG. 2 illustrates a side view of a small factor fan-in WLP in accordance with some examples of the disclosure.

FIG. 2 illustrates a side view of a fan-in WLP device structure 200. As shown, the WLP device structure 200 may include similar features as shown in the WLP device structure 100 but with an extended substrate and without a fan-out area. The WLP device structure 200 may include a substrate 210 that extends almost completely under a redistribution layer 225 (similar to the redistribution layer 125) and a molding compound 240 that encapsulates the substrate 210 and a portion of the redistribution layer 225. The substrate 210 may include a first substrate sidewall 212, a second substrate sidewall 213 on an opposite side of the substrate 210, a third substrate sidewall 215 on the same side but extending past the first substrate sidewall 212, and a fourth substrate sidewall 216 on the same side but extending past the second substrate sidewall 213. The molding compound 240 may include a first molding compound sidewall 241 and a second molding compound sidewall 242. The first molding compound sidewall 241 having a width 243 between the third substrate sidewall 215 and the outer surface of the first molding compound sidewall 241 and a second width 245 between the first substrate sidewall 212 and the outer surface of the first molding compound sidewall 241. The second molding compound sidewall 242 having a width 244 between the fourth substrate sidewall 216 and the outer surface of the second molding compound sidewall 242 and a second width 246 between the second substrate sidewall 213 and the outer surface of the second molding compound sidewall 242. The width 243 and the width 244 may be less than 10% of the width substrate 210 between the third substrate sidewall 215 and the fourth substrate sidewall 216. The width 245 and the width 246 may be larger than the width 243 and the width 244. This larger width of molding compound prevents cracking, chipping, and peeling of the molding compound usually associated with molding compounds having less than 10% width compared to the width of the substrate.

Figure 3:
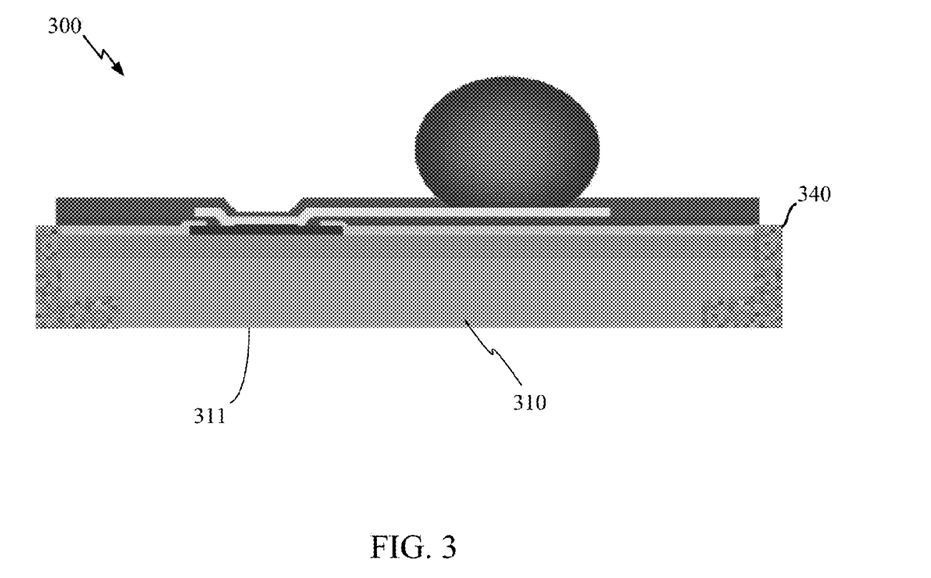
FIG. 3 illustrates a side view of a small factor fan-in WLP in accordance with some examples of the disclosure.

FIG. 3 illustrates a side view of a fan-in WLP device structure 300. As shown, the WLP device structure 300 may include features similar to the WLP device structure 200 but with an exposed substrate. The WLP device structure 300 may include a substrate 310 having a non-active substrate side 311 and a molding compound 340 that encapsulates the substrate 310 but leaves the non-active substrate side 311 exposed.

Figure 4:
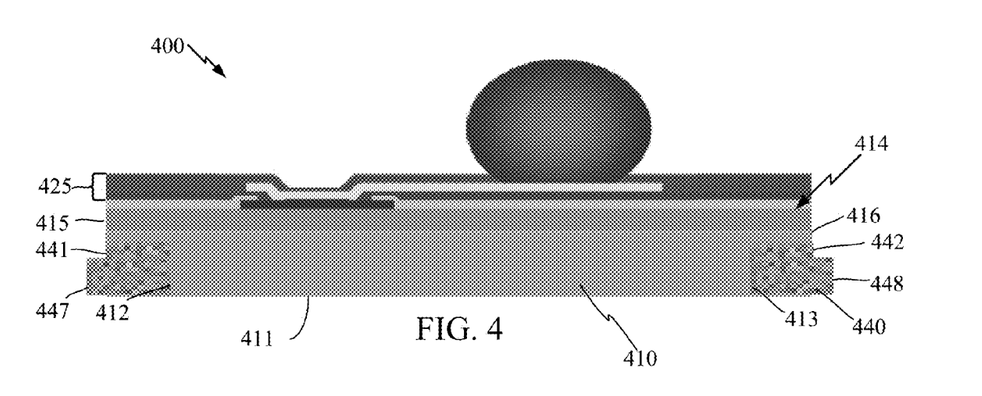
FIG. 4 illustrates a side view of a small factor fan-in WLP in accordance with some examples of the disclosure.

FIG. 4 illustrates another side view of a WLP device structure 400. The WLP device structure 400 may include features similar to the WLP device 300 but with reduced molding compound sidewalls. As shown, WLP device structure 400 may include a substrate 410 having a non-active substrate side 411 extending between a first substrate sidewall 412 and a second substrate sidewall 413 and an active substrate side 414 extending between a third substrate sidewall 415 and a fourth substrate sidewall 416, a redistribution layer 425 (similar to redistribution layer 125) on a passivation layer 418, and a molding compound 440 partially encapsulating the substrate 410. The molding compound 440 may include may include a first molding compound sidewall 441 even with the third substrate sidewall 415, a second molding compound sidewall 442 even with the fourth substrate sidewall 416, a third molding compound sidewall 447 extending horizontally beyond the first molding compound sidewall 441, and a fourth molding compound sidewall 448 extending horizontally beyond the second molding compound sidewall 442. This configuration leaves the a portion of the substrate 410 near the active substrate side 414, and the redistribution layer 425 (similar to redistribution layer 125) exposed on the sides and resulting in a small form factor. For example, the third molding compound sidewall extends past the first molding compound sidewall a width less than 10% of a width of the substrate between the third substrate sidewall 415 and the fourth substrate sidewall 416. It also avoids the need for lamination of the non-active substrate side 411 that would otherwise be required to prevent cracking, chipping, and peeling of the molding compound sidewalls.

Figure 5:
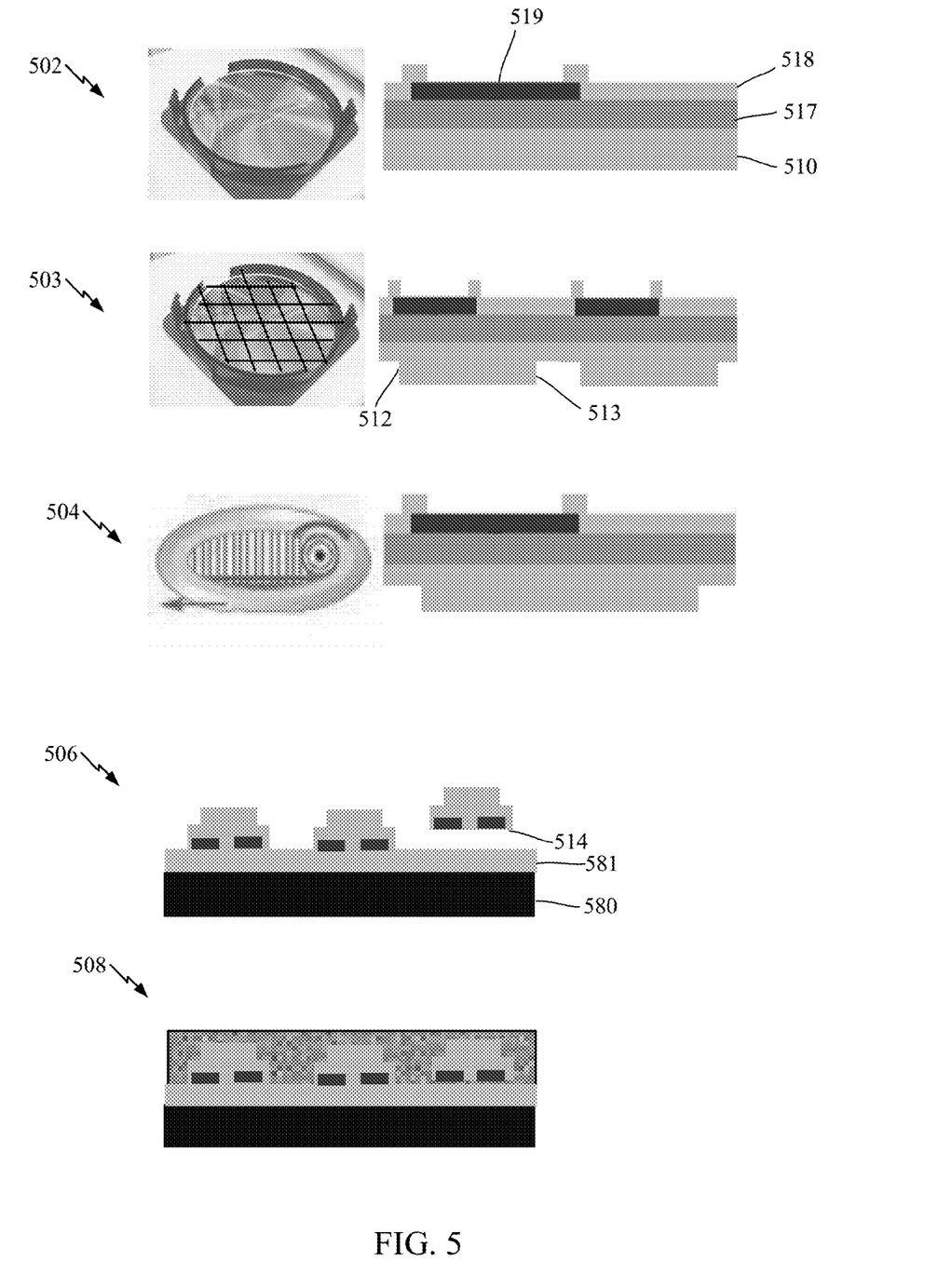
FIG. 5 illustrates a partial process flow for manufacturing a WLP in accordance with some examples of the disclosure.

FIG. 5 illustrates an exemplary partial process flow for manufacturing a WLP device. The partial process begins with a wafer 502 that is taped and ground to create a substrate 510 and a back end of line and front end of line layer 517 on the substrate 510. In some examples, this can occur prior to wafer reconstitution, redistribution, and ball drop. Next, portions of the wafer 503 are removed in the locations shown by the arrows to create a first substrate sidewall 512 and a second substrate sidewall 513. These can be accomplished using a partial saw at the arrow location (scribe lines) on the wafer backside. The wafers can be separated into individual chips by various methods. Next, the wafer 504 is sawed through to singulate the substrate 510. In some examples, stealth dicing, laser groove, or mechanical saws can be used to separate the wafer into individual substrates. Next, the wafer 506 is placed on the carrier 580 using adhesive tape 581 that faces an active substrate side 514. The wafer 508 is then encapsulated by a mold compound 540 that covers the substrate 510 and the back end of line and front end of line layer 517. A compression mold can be used to form a reconstituted wafer, for example. In some examples, the partial sawn substrate sidewalls can be enveloped in mold compound. In some examples, debonding may be used to remove the carrier and form the freestanding reconstituted wafer. A multi-layer redistribution layer can be formed, and solder balls can be dropped onto the reconstituted wafer in later process steps. In some examples, a package saw or similar device can be used to form thin or no molding compound sidewalls. For example, thin molding compound sidewalls can be down to 500 nanometers. The package saw may perform this task without chipping. Examples are shown in FIGS. 6A-C and 7A-C.

Figure 6A:
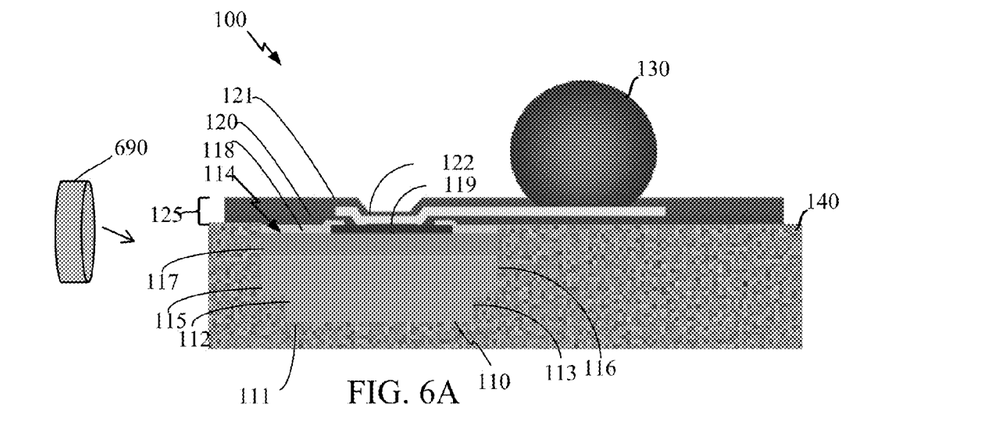
FIGS. 6A-C illustrate various single saw cuts for a WLP in accordance with some examples of the disclosure.

FIGS. 6A-C illustrate various single saw cuts for a WLP device structure. FIG. 6A is similar to FIG. 1. As shown, a single saw 690 is used to remove the edges of the WLP device structure 100, but the substrate 110 is still surrounded by the mold compound 140.

Figure 6B:
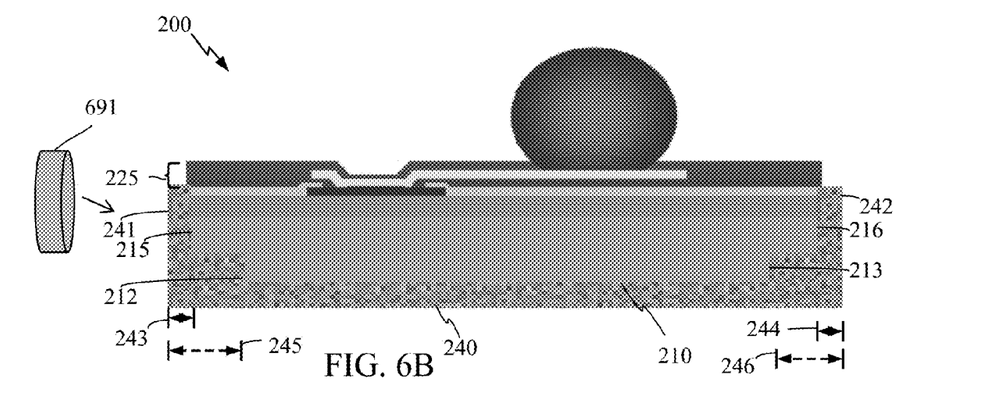

FIG. 6B is similar to FIG. 2. As shown, a single saw 691 is used to remove the edges of the WLP device structure 200, but the substrate 210 is still surrounded by the mold compound 240.

Figure 6C:
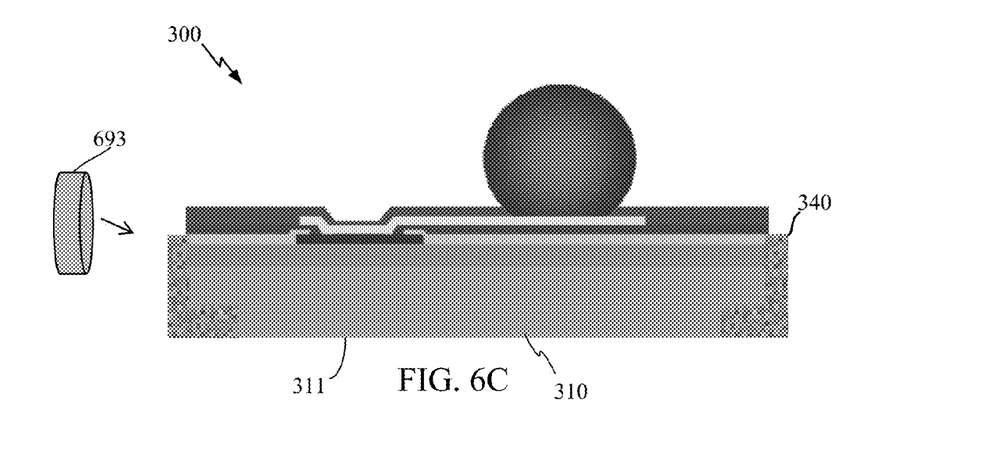

FIG. 6C is similar to FIG. 3. As shown, a single saw 693 is used to remove the edges of the WLP device structure 300. In this example, the substrate 310 is not surrounded by the mold compound 340. Instead, the mold compound 340 has been removed from, or was not added to, the non-active substrate side 311.

Figure 7A:
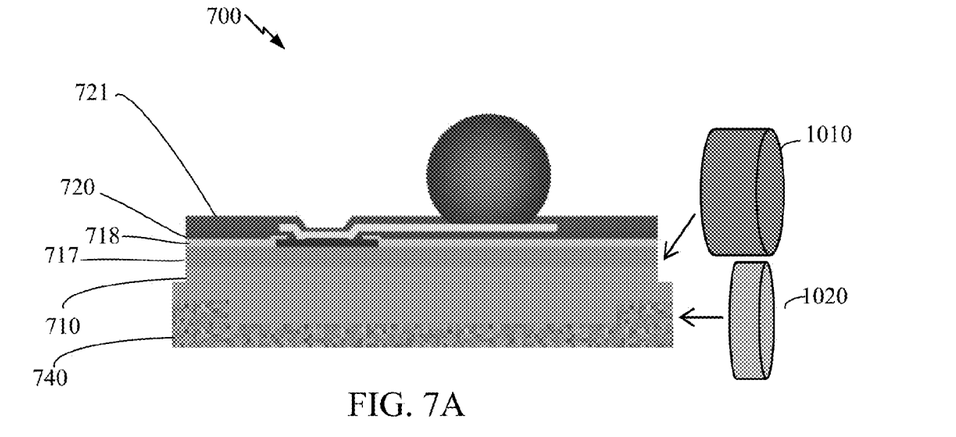
FIGS. 7A-C illustrate various multi-saw cuts for a WLP in accordance with some examples of the disclosure.

FIGS. 7A-C illustrate various multi-saw cuts for a WLP device structure. FIG. 7A shows two saws, Z1 saw 1010 and Z2 saw 1020. As shown, the Z1 saw 1010 has removed part of a back end of line and front end of line layer 717 and a portion of a substrate 710. The substrate 710 in this example spans a width of the WLP device structure 700. The Z2 saw 1020 removed the remaining mold compound on the sides of substrate 710.

Figure 7B:
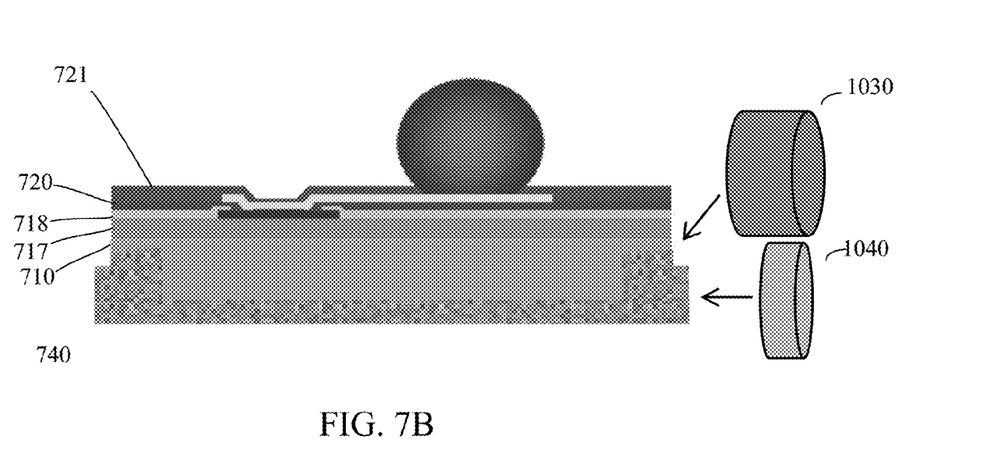

FIG. 7B shows two saws, Z1 saw 1030 and Z2 saw 1040. As shown, the Z1 saw 1030 has removed part of a back end of line and front end of line layer 717, a portion of a substrate 710, and a portion of the molding compound 740. The substrate 710 in this example does not span the width of the WLP device structure 700. The Z2 saw 1040 may remove some of the mold compound 740 on the sides of the substrate 710 as well.

Figure 7C:
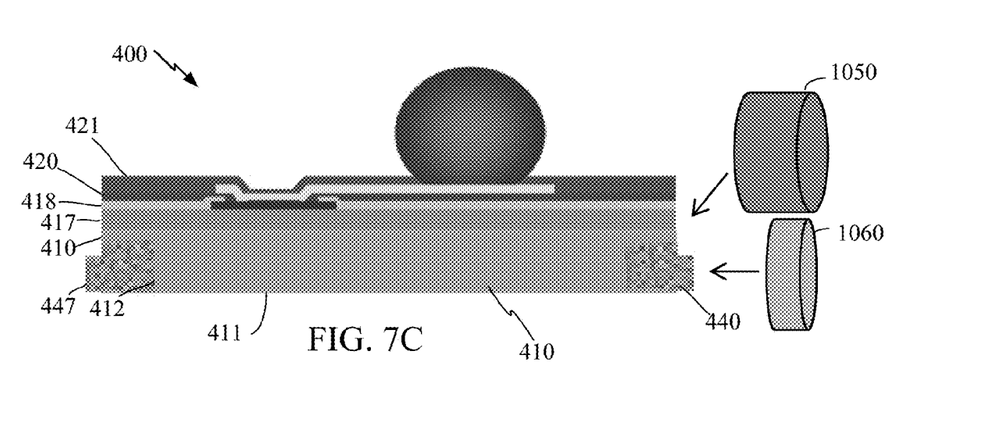

FIG. 7C is similar to FIG. 4. The figure shows two saws, Z1 saw 1050 and Z2 saw 1060. As shown, the Z1 saw 1050 has removed part of a back end of line and front end of line layer 417, a portion of a substrate 410, and a portion of the molding compound 440. The substrate 410 in this example does not span the width of the WLP device structure 400. The Z2 saw 1060 may remove some of the mold compound 440 on the sides of the WLP device structure 400 from the substrate 410, as well. The mold compound 440 has been removed from, or was not added to, the non-active substrate side 411.

In this description, certain terminology is used to describe certain features. The term "mobile device" can describe, and is not limited to, a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, a device in an automotive vehicle, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

Figure 8:
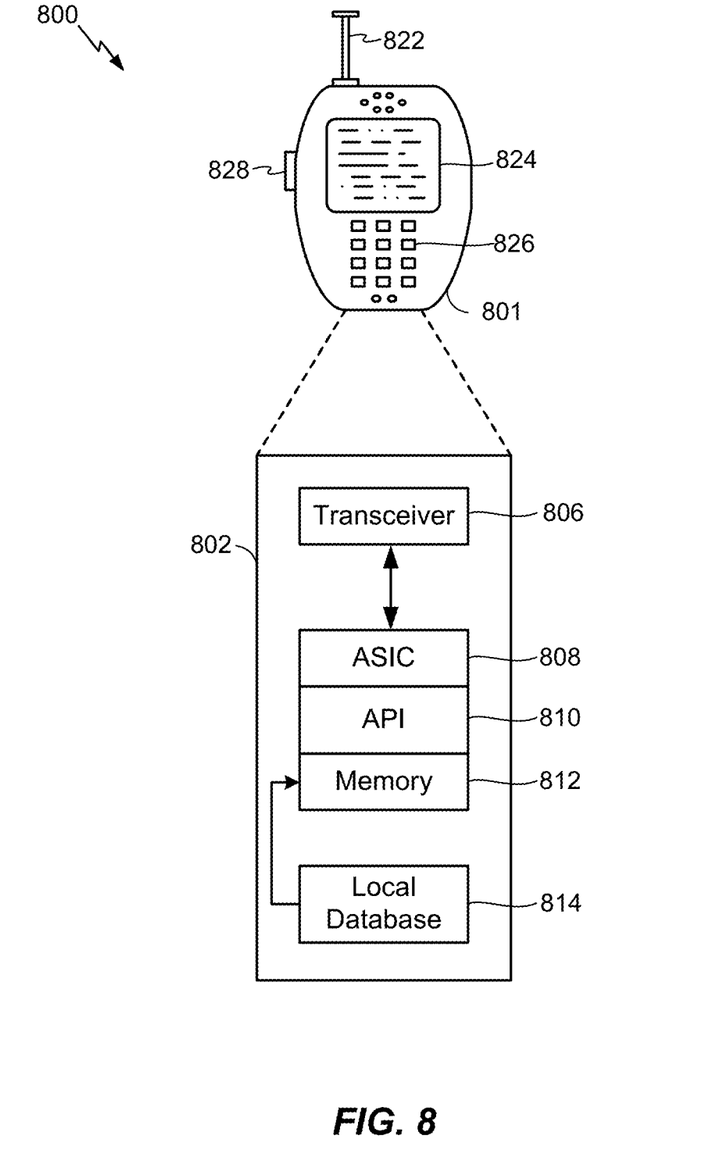
FIG. 8 illustrates exemplary user equipment (UE) in accordance with some examples of the disclosure.

Wafer level package devices according to the examples above (e.g. the WLP device structure 100, the WLP device structure 200, the WLP device structure 300, the WLP device structure 400, and the WLP device structure 700) can be used for a number of different applications, such as in the circuit components of a mobile device. Referring to FIG. 8 as an example, a system 800 may include an UE 801, (here a wireless device), which has a platform 802 that can receive and execute software applications, data and/or commands transmitted from a radio access network (RAN) that may ultimately come from a core network, the Internet and/or other remote servers and networks. Platform 802 can include transceiver 806 operably coupled to an application specific integrated circuit ("ASIC" 808), or other processor, microprocessor, logic circuit, or other data processing device. ASIC 808 or other processor executes the application programming interface ("API") 810 layer that interfaces with any resident programs in memory 812 of the wireless device. Memory 812 can be comprised of read-only or random-access memory (RAM and ROM), EEPROM, flash cards, or any memory common to computer platforms. Platform 802 also can include local database 814 that can hold applications not actively used in memory 812. Local database 814 is typically a flash memory cell, but can be any secondary storage device as known in the art, such as magnetic media, EEPROM, optical media, tape, soft or hard disk, or the like. Internal platform 802 components can also be operably coupled to external devices such as antenna 822, display 824, push-to-talk button 828 and keypad 826 among other components, as is known in the art.

The wireless communication between UE 801 and the RAN can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

Nothing stated or illustrated depicted in this application is intended to dedicate any component, step, feature, benefit, advantage, or equivalent to the public, regardless of whether the component, step, feature, benefit, advantage, or the equivalent is recited in the claims.

What is claimed is:

1. A wafer level package device comprising:
   a substrate including a non-active substrate side that extends between a first substrate sidewall and a second substrate sidewall and an active substrate side that extends between a third substrate sidewall and a fourth substrate sidewall, the first substrate sidewall opposite the second substrate sidewall and the third substrate sidewall opposite the fourth substrate sidewall;
   an integrated circuit layer proximate the active substrate side;
   a redistribution layer coupled to the integrated circuit layer, the redistribution layer including a metal layer and a dielectric layer; and
   a molding compound including a first molding compound sidewall and a second molding compound sidewall opposite the first molding compound sidewall, the molding compound encapsulates the substrate and the integrated circuit layer such that a first width between the first molding compound sidewall and the first substrate sidewall is greater than a second width between the first molding compound sidewall and the third substrate sidewall, and the metal layer being free of the molding compound.

2. The wafer level package device of claim 1, wherein the redistribution layer is configured to redistribute power to a plurality of active circuits of the integrated circuit layer.

3. The wafer level package device of claim 2, wherein the molding compound is at least partially in contact with the dielectric layer.

4. The wafer level package device of claim 3, wherein the dielectric layer is a photodielectric.

5. The wafer level package device of claim 1, wherein the wafer level package device is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

6. A wafer level package device comprising:
   a substrate including a non-active substrate side that extends between a first substrate sidewall and a second substrate sidewall and an active substrate side that extends between a third substrate sidewall and a fourth substrate sidewall, the first substrate sidewall opposite the second substrate sidewall and the third substrate sidewall opposite the fourth substrate sidewall;
   an integrated circuit layer proximate the active substrate side;
   a redistribution layer coupled to the integrated circuit layer, the redistribution layer including a metal layer and a dielectric layer; and
   a molding compound including a first molding compound sidewall and a second molding compound sidewall opposite the first molding compound sidewall, the molding compound encapsulates the substrate and the integrated circuit layer while leaving the metal layer exposed such that a first width between the first molding compound sidewall and the first substrate sidewall is greater than a second width between the first molding compound sidewall and the third substrate sidewall.

7. The wafer level package device of claim 6, wherein a third width between the second molding compound sidewall and the fourth substrate sidewall is approximately the second width between the first molding compound sidewall and the third substrate sidewall.

8. The wafer level package device of claim 7, wherein the second width between the first molding compound sidewall and the third substrate sidewall is less than 10% of a fourth width of the substrate between the third substrate sidewall and the fourth substrate sidewall.

9. The wafer level package device of claim 8, wherein a fifth width between the second molding compound sidewall and the second substrate sidewall is approximately the first width between the first molding compound sidewall and the first substrate sidewall.

10. The wafer level package device of claim 9, wherein the redistribution layer is configured to redistribute power to a plurality of active circuits of the integrated circuit layer.

11. The wafer level package device of claim 10, wherein the molding compound is at least partially in contact with the dielectric layer.

12. The wafer level package device of claim 11, wherein the dielectric layer is a photodielectric.

13. The wafer level package device of claim 12, further comprising a solder ball mounted on the dielectric layer and in contact with the metal layer.

14. A wafer level package device comprising:
a substrate including a non-active substrate side that extends between a first substrate sidewall and a second substrate sidewall and an active substrate side that extends between a third substrate sidewall and a fourth substrate sidewall, the first substrate sidewall opposite the second substrate sidewall and the third substrate sidewall opposite the fourth substrate sidewall;
an integrated circuit layer proximate the active substrate side;
a redistribution layer coupled to the integrated circuit layer, the redistribution layer including a dielectric layer in contact with the integrated circuit layer, a polymer layer on the dielectric layer, and a metal layer in the polymer layer;
a molding compound including a first molding compound sidewall even with the third substrate sidewall, a second molding compound sidewall even with the fourth substrate sidewall, a third molding compound sidewall that extends horizontally beyond the first molding compound sidewall, and a fourth molding compound sidewall that extends horizontally beyond the second molding compound sidewall; and the molding compound encapsulates the substrate such that a sixth width between the third molding compound sidewall and the first substrate sidewall is greater than a first width between the first molding compound sidewall and the first substrate sidewall.

15. The wafer level package device of claim 14, wherein an eighth width of the third molding compound sidewall extends horizontally beyond the first molding compound sidewall is less than 10% of a fourth width of the substrate between the third substrate sidewall and the fourth substrate sidewall, and a seventh width of the fourth molding compound sidewall extends horizontally beyond the second molding compound sidewall is approximately the eighth width between the third molding compound sidewall extends horizontally beyond the first molding compound sidewall.

16. The wafer level package device of claim 15, wherein the first width between the first molding compound sidewall and the first substrate sidewall is smaller than the sixth width between the third molding compound sidewall and the first substrate sidewall.

17. The wafer level package device of claim 16, wherein a fifth width between the second molding compound sidewall and the second substrate sidewall is approximately the first width between the first molding compound sidewall and the first substrate sidewall.

18. The wafer level package device of claim 17, wherein the redistribution layer is configured to redistribute power to a plurality of active circuits of the integrated circuit layer.

19. The wafer level package device of claim 18, wherein the molding compound is at least partially in contact with the dielectric layer.

20. The wafer level package device of claim 19, wherein the dielectric layer is a photodielectric.

\* \* \* \* \*